United States Patent
Chiu et al.

(10) Patent No.: US 10,964,781 B2
(45) Date of Patent: Mar. 30, 2021

(54) HIGH VOLTAGE RESISTOR DEVICE

(71) Applicant: Taiwan Semiconductor Manufacturing Co., Ltd., Hsin-Chu (TW)

(72) Inventors: Yi-Cheng Chiu, New Taipei (TW); Wen-Chih Chiang, Hsinchu (TW); Chun Lin Tsai, Hsin-Chu (TW); Kuo-Ming Wu, Hsinchu (TW); Shiuan-Jeng Lin, Hsinchu (TW); Yi-Min Chen, Hsinchu (TW); Hung-Chou Lin, Douliu (TW); Karthick Murukesan, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/199,483

(22) Filed: Nov. 26, 2018

(65) Prior Publication Data
US 2019/0109189 A1 Apr. 11, 2019

Related U.S. Application Data

(62) Division of application No. 15/694,341, filed on Sep. 1, 2017, now Pat. No. 10,297,661.
(Continued)

(51) Int. Cl.
*H01L 29/06* (2006.01)
*H01L 29/10* (2006.01)
(Continued)

(52) U.S. Cl.
CPC ......... *H01L 29/063* (2013.01); *H01L 23/528* (2013.01); *H01L 23/5226* (2013.01);
(Continued)

(58) Field of Classification Search
CPC ............. H01L 29/063; H01L 29/66712; H01L 29/7802; H01L 23/5226; H01L 29/1095;
(Continued)

(56) References Cited

U.S. PATENT DOCUMENTS 6,531,355 B2  3/2003 Mosher et al.
8,129,815 B2  3/2012 Banerjee et al.
(Continued)

OTHER PUBLICATIONS

Sunitha, et al. "Reduced Surface Field Technology for LDMOS: A Review." International Journal of Emerging Technology and Advanced Engineering, vol. 4, Issue 6, Jun. 2014.
(Continued)

*Primary Examiner* — Hoang-Quan Ho
(74) *Attorney, Agent, or Firm* — Eschweiler & Potashnik, LLC

(57) ABSTRACT

The present disclosure, in some embodiments, relates to a high voltage resistor device. The device includes a buried well region disposed within a substrate and having a first doping type. A drift region is disposed within the substrate and contacts the buried well region. The drift region has the first doping type. A body region is disposed within the substrate and has a second doping type. The body region laterally contacts the drift region and vertically contacts the buried well region. An isolation structure is over the drift region and a resistor structure is over the isolation structure.

20 Claims, 10 Drawing Sheets

Related U.S. Application Data

(60) Provisional application No. 62/527,122, filed on Jun. 30, 2017.

(51) Int. Cl.
  *H01L 23/528* (2006.01)
  *H01L 23/522* (2006.01)
  *H01L 29/78* (2006.01)
  *H01L 29/66* (2006.01)
  *H01L 29/8605* (2006.01)

(52) U.S. Cl.
  CPC ...... *H01L 23/5228* (2013.01); *H01L 29/0649* (2013.01); *H01L 29/0692* (2013.01); *H01L 29/1095* (2013.01); *H01L 29/66166* (2013.01); *H01L 29/66712* (2013.01); *H01L 29/7802* (2013.01); *H01L 29/8605* (2013.01)

(58) Field of Classification Search
  CPC ............... H01L 29/0649; H01L 23/528; H01L 23/5228; H01L 29/8605; H01L 29/66166
  See application file for complete search history.

(56) References Cited

U.S. PATENT DOCUMENTS

| | | |
|---|---|---|
| 2011/0006339 A1 | 1/2011 | Uchida et al. |
| 2012/0091529 A1 | 4/2012 | Cheng et al. |
| 2012/0319240 A1 | 12/2012 | Su et al. |
| 2013/0032862 A1 | 2/2013 | Su et al. |
| 2014/0021560 A1* | 1/2014 | Su ................ H01L 27/0629 257/380 |
| 2015/0008539 A1* | 1/2015 | Kanda ............ H01L 21/761 257/409 |
| 2015/0262995 A1 | 9/2015 | Huo et al. |
| 2015/0311197 A1 | 10/2015 | Saito |
| 2016/0260704 A1* | 9/2016 | Huo ................ H01L 27/0629 |

OTHER PUBLICATIONS

Unknown Author. "Device Design Techniques." Unknown publishing date. Retrieved online on Jun. 21, 2017 from http://www.iue.tuwien.ac.at/phd/triebl/node9.html.

Non-Final Office Action dated Sep. 19, 2018 for U.S. Appl. No. 15/694,341.

\* cited by examiner

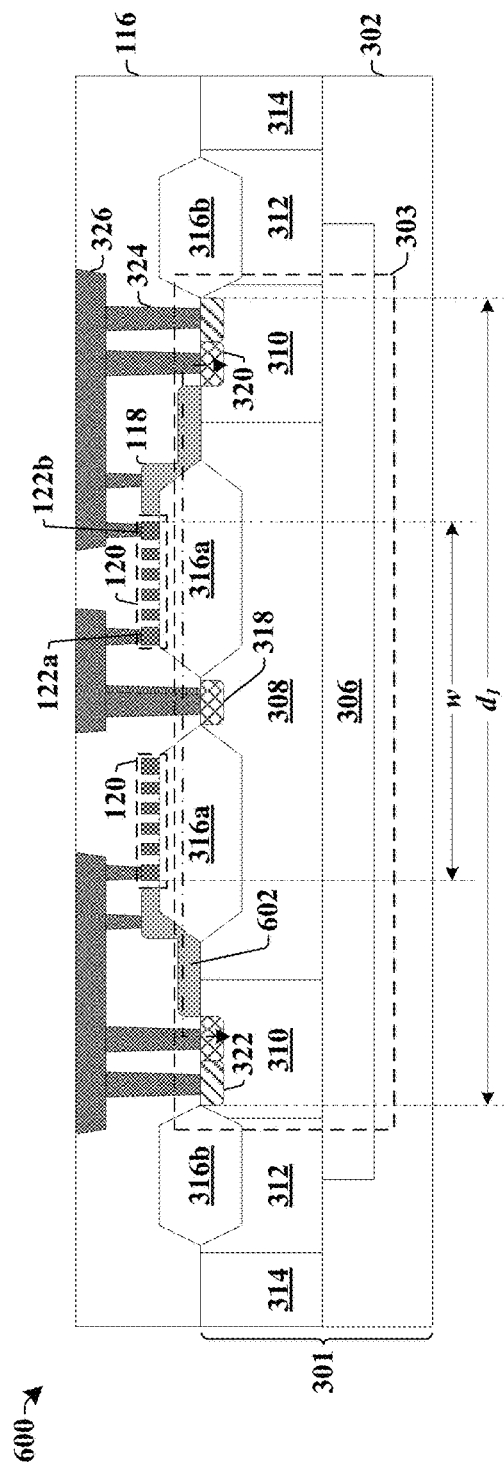
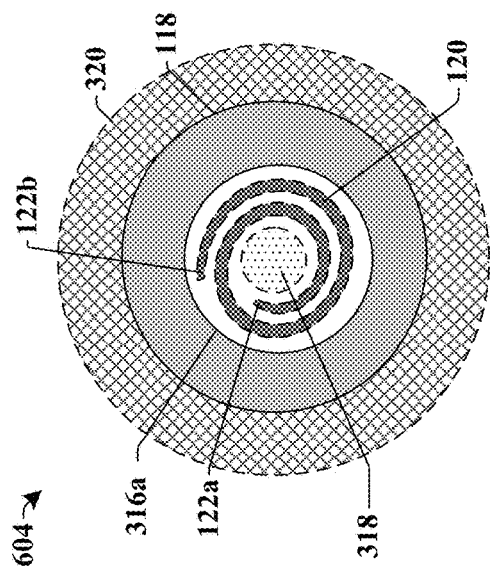
Fig. 6A
Fig. 6B

HIGH VOLTAGE RESISTOR DEVICE

REFERENCE TO RELATED APPLICATIONS

This Application is a Divisional of U.S. application Ser. No. 15/694,341, filed on Sep. 1, 2017, which claims priority to U.S. Provisional Application No. 62/527,122, filed on Jun. 30, 2017. The contents of the above-referenced Patent Applications are hereby incorporated by reference in their entirety.

BACKGROUND

Modern day integrated chips use a wide range of devices to achieve varying functionalities. In general, integrated chips comprise active devices and passive devices. Active devices include transistors (e.g., MOSFETS), while passive devices include inductors, capacitors, and resistors. Resistors are widely used in many applications such as RC circuits, power drivers, power amplifiers, RF applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D illustrate some additional embodiments of a disclosed high voltage resistor device.

DETAILED DESCRIPTION

Figure 1:
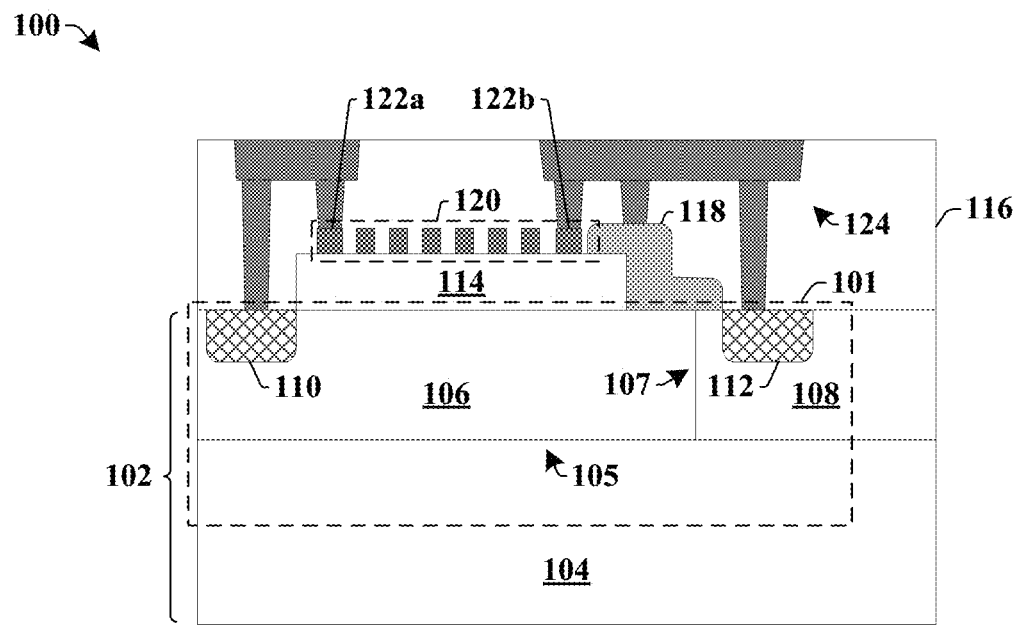
FIG. 1 illustrates a cross-sectional view of some embodiments of a high voltage resistor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, the use of high voltage circuits on integrated chips has seen increased use. For example, in recent years, the increasing market for cellular and RF (radio frequency) devices has resulted in a significant increase in the use of high voltage circuits. Within high voltage circuits, some applications use high voltage resistors (e.g., resistors that are able to withstand voltages of greater than or equal to approximately 400 V). One common type of high voltage resistor used on an integrated chip is a polysilicon resistor. High voltage polysilicon resistors typically are formed over an isolation structure that separates the resistor from a substrate. High voltage polysilicon resistors face a number of problems not present in low voltage circuits, such as breakdown issues. For example, if a large voltage (e.g., several hundred volts) is applied to a resistor, the voltage across the isolation structure is several hundred volts and may result in dielectric breakdown of the isolation structure (i.e., an electrical short between the resistor and the substrate) damaging the device.

To prevent breakdown, a region isolated by junction isolation may be arranged within a substrate (e.g., an n-well within a p-type substrate) underlying a high voltage resistors. The junction isolation allows for a bias to be applied to the substrate underlying an isolation structure, thereby mitigating dielectric breakdown by reducing a voltage difference between a resistor and the substrate. However, junction breakdown is limited by doping concentration, causing the high voltage resistors to often experience device breakdown before a sufficiently-high voltage is reached. To improve device breakdown, a resistor may be formed over an isolation structure and coupled to a high voltage junction termination (HVJT) devices surrounding the resistor. However, such resistors have a large size. Furthermore, since the isolation structures are often thin, the resistance of the resistor is still limited due to dielectric breakdown.

The present disclosure relates to a high voltage resistor device that is able to receive high voltages using a small footprint, and an associated method of fabrication. In some embodiments, the high voltage resistor device comprises a substrate having a first region comprising a first doping type abutting an overlying RESURF drift region having a second doping type along a p-n junction. An isolation structure is over the p-n junction and a gate structure is over the substrate and the isolation structure. A resistor structure comprising a resistive material is over the isolation structure. The resistor structure has a high-voltage terminal proximate to the drain region and a low-voltage terminal proximate to the gate structure. Forming the resistor structure over the p-n junction causes voltages within the RESURF drift region and the resistor structure to gradually decrease along a same direction, thereby limiting a maximum voltage difference over the isolation structure, and mitigating dielectric breakdown of the isolation structure even at high voltages (e.g., greater than or equal to 600 V).

FIG. 1 illustrates a cross-sectional view of some embodiments of a disclosed high voltage resistor device 100.

The high voltage resistor device 100 comprises a high voltage transistor structure 101 coupled to a resistor structure 120. The high voltage transistor structure 101 is arranged within a substrate 102 and includes a first region 104 having a first doping type (e.g., p-type) and an overlying RESURF (reduced surface field) drift region 106 having a second doping type (e.g., n-type). In some embodiments, the first region 104 may comprise an intrinsically doped substrate. The different doping types of the first region 104 and the RESURF drift region 106 form a vertical p-n junction 105. A body region 108 having the first doping type is arranged over the first region 104 and laterally abuts the RESURF drift region 106 along a lateral p-n junction 107. A drain region 110 is arranged within the RESURF drift region 106. In some embodiments, a source region 112 may be arranged within the body region 108. The drain region 110 and the source region 112 have the second doping type, with a higher doping concentration than the RESURF drift region 106.

An isolation structure 114 comprising a dielectric material (e.g., an oxide) is arranged over the RESURF drift region 106. A gate structure 118 is arranged over the substrate 102 and the isolation structure 114 at a position over a space that is laterally between the drain region 110 and the source region 112. The gate structure 118 comprises gate electrode that is separated from the substrate 102 by a gate dielectric layer.

A resistor structure 120 is arranged over the isolation structure 114. The resistor structure 120 comprises a high-voltage terminal 122a proximate to the drain region 110 and a low-voltage terminal 122b proximate to the gate structure 118. The resistor structure 120 comprises a resistive material (e.g., polysilicon) arranged in a path extending between the high-voltage terminal 122a and the low-voltage terminal 122b. One or more conductive interconnect structures 124 are disposed within a dielectric structure 116 over the substrate 102. The one or more conductive interconnect structures 124 are configured to couple the high-voltage terminal 122a of the resistor structure 120 to the drain region 110 and the low-voltage terminal 122b to the gate structure 118 and/or the source region 112.

During operation of the high voltage resistor device 100, the high-voltage terminal 122a is configured to receive a first voltage and the low-voltage terminal 122b configured to output a second voltage smaller than the first voltage. The resistor structure 120 is configured to dissipate power to drop a voltage on the resistor structure 120 from the first voltage to the second voltage. Since the high-voltage terminal 122a is coupled to the drain region 110 a voltage drop will also occur within the RESURF drift region 106 of the high voltage transistor structure 101 under the resistor structure 120.

The vertical p-n junction 105 causes a depletion region to extend deep within the RESURF drift region 106 (e.g., to a top of the RESURF drift region 106). The depletion region causes an electric field generated when a voltage is applied to the resistor structure 120 to be relatively uniform along the RESURF drift region 106, so that voltages within the RESURF drift region 106 and the resistor structure 120 will decrease along a same direction (e.g., left to right in FIG. 1). By decreasing voltages within the RESURF drift region 106 and the resistor structure 120 along a same direction, a maximum voltage difference over the isolation structure 114 is limited, mitigating dielectric breakdown of the isolation structure 114.

Figure 2:
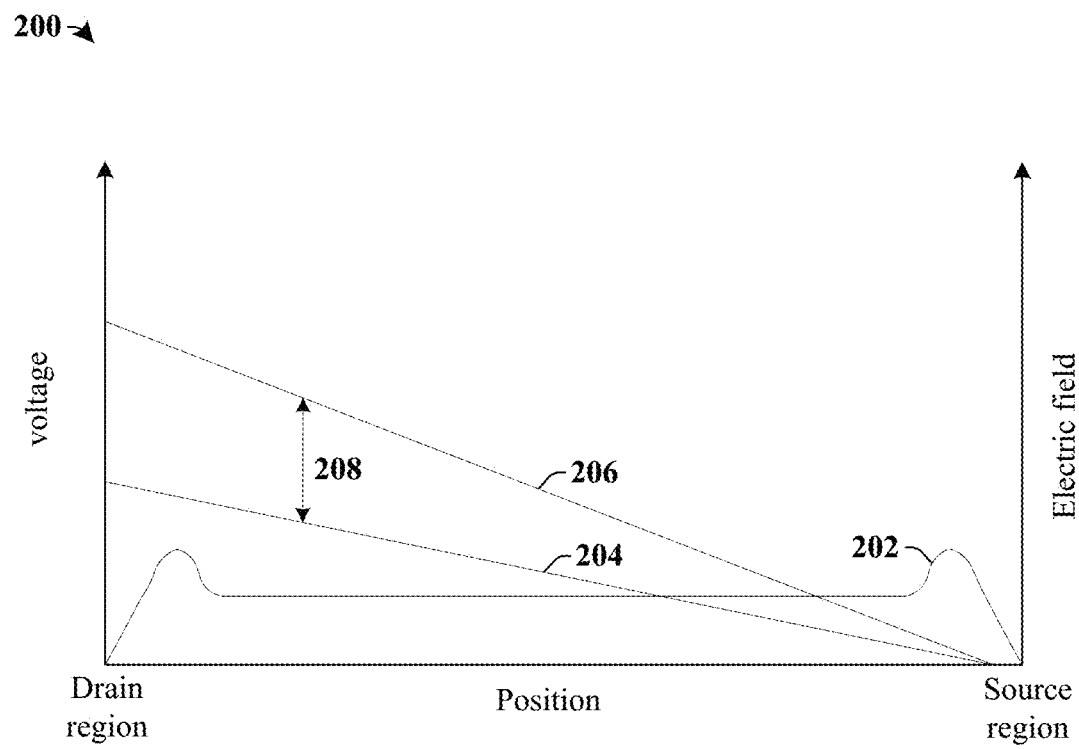
FIG. 2 illustrates some embodiments of a graph showing voltages as a function of position within a RESURF drift region and a resistor structure of a disclosed high voltage resistor device.

For example, FIG. 2 illustrates some embodiments of a graph 200 showing voltages as a function of position within a RESURF drift region and a resistor structure of a disclosed high voltage resistor device.

As shown in graph 200, the p-n junction results in the formation of a relatively uniform electric field 202 within a RESURF drift region (106 of FIG. 1) underlying an isolation structure (114 of FIG. 1). The relatively uniform electric field 202 results in a voltage drop that is distributed along the RESURF drift region. In some embodiments, the voltage drop may drop from a high voltage (e.g., in a range of between approximately 500V and approximately 900V) applied to the high voltage terminal to a voltage of substantially zero volts at the low-voltage terminal and directly below the low voltage terminal. In some embodiments, since the gate structure 118 is coupled to the low-voltage terminal, the gate structure 118 may be held at a voltage of substantially zero volts.

By distributing the voltage drop along the RESURF drift region, a voltage 204 within the RESURF drift region gradually decreases as a distance from the drain region increases. A voltage 206 within the resistor structure also gradually decreases as a distance from the drain region increases. Since the voltage 204 within the RESURF drift region and the voltage 206 within the resistor structure gradually decrease along a same direction (e.g., from the drain region to the source region), a maximum voltage difference 208 over the isolation structure is limited. By limiting the maximum voltage difference 208 over the isolation structure, the disclosed resistor structure is able to be used at high voltage while consuming a small size and offering a low risk of dielectric breakdown of the isolation structure.

Figure 3A:
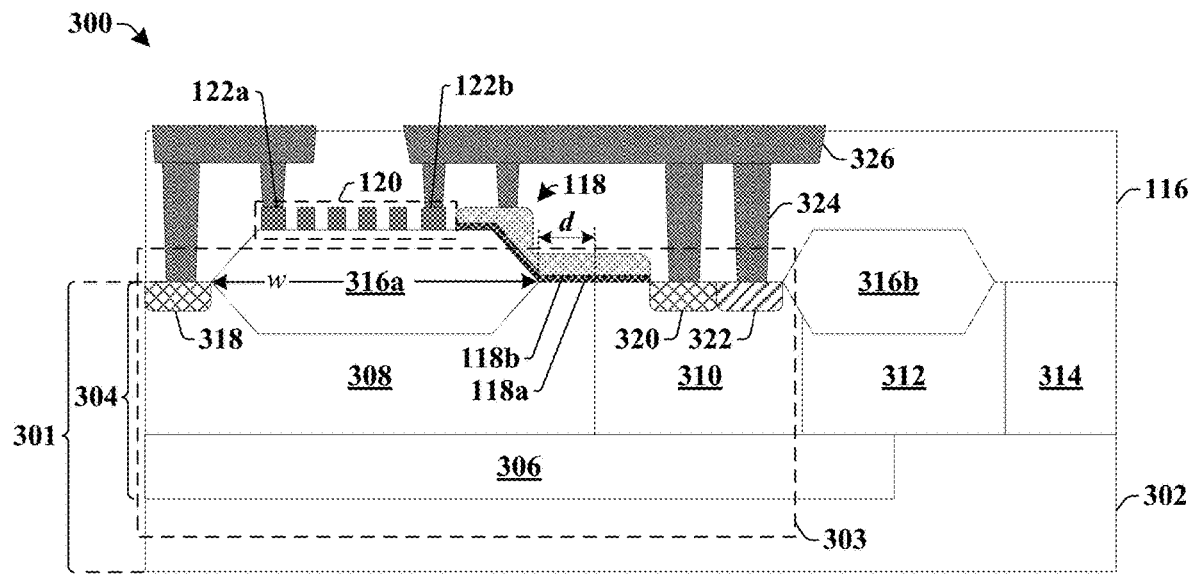
FIGS. 3A-3B illustrate some additional embodiments of a disclosed high voltage resistor device.
Figure 3B:
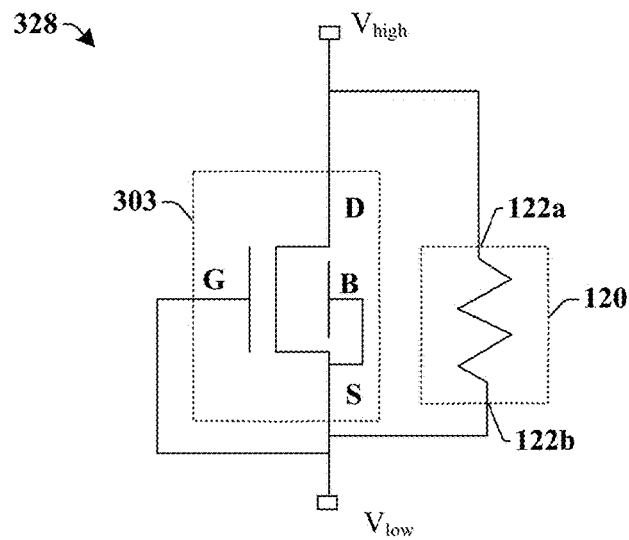

FIGS. 3A-3B illustrate some additional embodiments of a disclosed high voltage resistor device.

As shown in cross-sectional view 300, the high voltage resistor device comprises a resistor structure 120 coupled to a high voltage transistor structure 303. The high voltage transistor structure 303 comprises a RESURF drift region 304 having a second doping type (e.g., an n-type doping) contacting a first region 302 of a substrate 301 having a first doping type (e.g., a p-type doping) along a vertical p-n junction. In some embodiments, the RESURF drift region 304 may comprise a buried well region 306 and a drift region 308 overlying the buried well region 306. In some embodiments, the buried well region 306 may comprise a doped region implanted within a semiconductor substrate, while the drift region 308 may comprise an epitaxial semiconductor material grown over the semiconductor substrate. In other embodiment, the buried well region 306 and the drift region 308 may both comprise doped regions implanted within a semiconductor substrate.

A body region 310 comprising a semiconductor material having the first doping type laterally contacts the drift region 308 along a lateral p-n junction. In some embodiments, the buried well region 306 may have an upper boundary contacting the drift region 308 and the body region 310 and a lower boundary contacting the first region 302. In some embodiments, the buried well region 306 extends beyond opposing sides of the body region 310, so that the body region 310 is electrically isolated the substrate 301 by the buried well region 306. A drain region 318 is arranged within the drift region 308 and a source region 320 is arranged within the body region 310. The drain region 318 and the source region 320 comprise a higher concentration of the second doping type (e.g., an n+ doping) than the buried well region 306 and/or the drift region 308. In some embodiments, a body contact region 322 may be arranged within the body region 310 at a location adjacent to the source region 320. The body contact region 322 has the first doping type (e.g., a p+ doping).

In some additional embodiments, a first isolation region 312 and a second isolation region 314 may be disposed within the substrate 301. The first isolation region 312 comprises a semiconductor material having the second doping type and laterally contacting the body region 310. The second isolation region 314 comprises a semiconductor material having the first doping type and laterally contacting the first isolation region 312. The first isolation region 312 and the second isolation region 314 are configured to provide for isolation from adjacent devices through junction isolation.

Isolation structures 316a-316b are arranged over the substrate 301. The isolation structures 316a-316b comprise a first isolation structure 316a over the drift region 308 and a second isolation structure 316b over the first isolation region 312. The first isolation structure 316a comprises a first side facing the drain region 318 and an opposing second side facing away from the drain region 318. In some embodiments, the second side of the first isolation structure 316a may be set back from body region 310 by a non-zero distance d. In some embodiments, the first isolation structure 316a and/or the second isolation structure 316b may protrude outward from the substrate 301. In some embodiments, the isolation structures 316a-316b may comprise a field oxide or a shallow trench isolation region, for example.

A resistor structure 120 and a gate structure 118 are arranged over the first isolation structure 316a. The resistor structure 120 comprises a path of resistive material (e.g., polysilicon) extending between a high-voltage terminal 122a proximate to the first side of the first isolation structure 316a and a low-voltage terminal 122b proximate to the second side of the first isolation structure 316a. The gate structure 118 comprises a gate dielectric layer 118a and a gate electrode 118b separated from the first isolation structure 316a and/or the substrate 301 by way of the gate dielectric layer 118a. In some embodiments, the gate structure 118 may continuously extend from a first position over the first isolation structure 316a to a second position between the first isolation structure 316a and the body region 310.

One or more interconnect layers 324-326 are disposed within a dielectric structure 116 over the substrate 102. The one or more interconnect layers 324-326 are configured to couple the high-voltage terminal 122a of the resistor structure 120 to the drain region 318 and the low-voltage terminal 122b to the gate structure 118, the source region 320, and/or the body contact region 322. FIG. 3B illustrates a schematic diagram 328 showing some embodiments of connections of the source region (S), the drain region (D), the gate structure (G) of the high voltage transistor structure 303, and the high voltage terminal 122a and the low-voltage terminal 122b of the resistor structure 120.

Referring again to FIG. 3A, in some embodiments, the one or more interconnect layers 324-326 may comprise alternating layers of interconnect wires 326 (configured to provide lateral connections) and interconnect vias 324 (configured to provide vertical connections). In various embodiments, the one or more interconnect layers 324-326 may comprise aluminum, copper, tungsten, or some other metal.

In some embodiments, the dielectric structure 116 may comprise a plurality of stacked inter-level dielectric (ILD) layers. In various embodiments, the plurality of stacked inter-level dielectric (ILD) layers may comprise one or more of an oxide (e.g., $SiO_2$, SiCO, etc.), a fluorosilicate glass, a phosphate glass (e.g., borophosphate silicate glass), etc.

During operation of the high voltage resistor device, the gate structure 118 may be held at a zero voltage. However, a voltage applied to the resistor structure 120 will generate an electric field within the drift region 308. The vertical p-n junction (between the first region 302 and the RESURF drift region 304) results in a depletion region extending into the drift region 308, causing the electric field within the drift region 308 to be relatively uniform and also causing a voltage drop within the drift region 308 to be evenly distributed. Because the vertical p-n junction of the disclosed high voltage device causes the voltage to drop to be evenly distributed over the drift region 308, the disclosed resistor structure 120 can be used to dissipate large voltages (e.g., in a range of between approximately 500V and approximately 900V) without undergoing dielectric breakdown of the first isolation structure 316a.

Figure 4A:
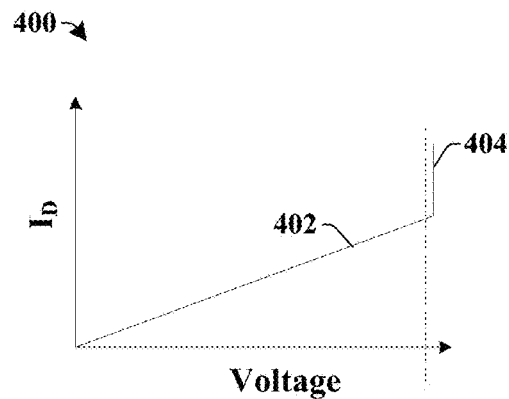
FIGS. 4A-4B illustrate some embodiments of a graphs describing operating characteristics of a disclosed high voltage resistor device.

However, when a sufficiently high voltage (i.e., a breakdown voltage) is applied to the drain region 318, a reverse bias will cause the high voltage transistor structure 303 to undergo breakdown. When the high voltage transistor structure 303 undergoes breakdown, the resistor structure 120 also fails to operate properly. For example, FIG. 4A illustrates some embodiments of a graph 400 showing current vs. voltage for an exemplary disclosed high voltage resistor device. As shown in graph 400, when a voltage applied to the drain region (i.e., a high voltage) of the high voltage transistor structure is smaller than a breakdown voltage of the high voltage transistor structure, the high voltage resistor structure is in a normal state of operation. Within the normal state of operation, the high voltage resistor structure is configured to provide a first current 402 that is proportion to an applied voltage according to a first constant of proportionality. However, when a voltage applied to the drain region of the high voltage transistor structure exceeds the breakdown voltage of the high voltage transistor structure, the high voltage resistor structure begins to malfunction and provides a second current 404 that is proportion to an applied voltage according to a second constant of proportionality that is larger than the first constant of proportionality.

Because normal operation of the resistor structure is maintained when the voltage applied to the drain region of the high voltage transistor structure is less than a breakdown voltage of the high voltage transistor structure, a width w of the first isolation structure (e.g., 316a of FIG. 3A) scales with a voltage value the high voltage resistor structure (e.g., 120 of FIG. 3A) is able to receive before breakdown of the high voltage transistor structure. For example, increasing the width w of the first isolation structure increases a voltage value of the resistor structure is configured to receive.

Figure 4B:
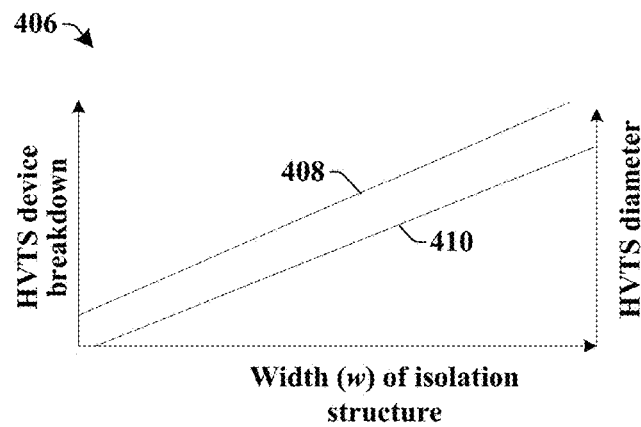

FIG. 4B illustrates some embodiments of a graph 406 showing a relationship between a width of an isolation structure, a breakdown voltage of a disclosed high voltage resistor device, and a diameter of a disclosed high voltage transistor structure (HVTS).

As shown in graph 406, as a width w of the first isolation structure increases (shown along the x-axis), a breakdown voltage 408 of the high voltage transistor structure proportionally increases (shown along the left y-axis). Since the width w of the first isolation structure is proportional to a breakdown voltage of the high voltage transistor structure, a width w of the first isolation structure may be scaled to achieve different breakdown voltage values. As also shown in graph 406, as a width w of the first isolation structure increases (shown along the x-axis), a diameter of the of the high voltage transistor structure 410 also proportionally increases (shown along the right y-axis), such that a high voltage resistor structure having a larger diameter is able to received larger voltages. For example, a resistor structure configured to receive a voltage value of 600 V may have an isolation structure with a width w that gives the resistor structure a diameter of approximately 240 um, while a resistor structure configured to receive a voltage value of 800 V may have an isolation structure with a width w that gives the resistor structure a diameter of approximately 328 um.

Figure 5:
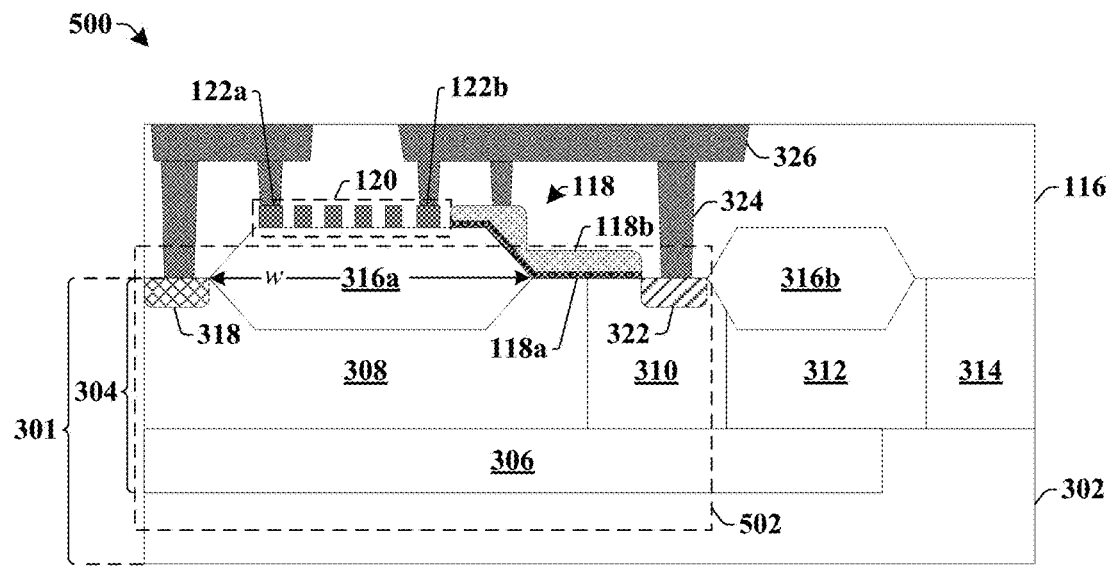
FIG. 5 illustrates a cross-sectional view of some additional embodiments of a disclosed high voltage resistor device.

It will be appreciated that the high voltage transistor structure used within the disclosed high voltage resistor structure is not configured to function as a transistor, and thus, no current path is present during operation between the drain region and the source region. Accordingly, in some embodiments the source region (e.g., 320 of FIG. 3A) can be removed from the high voltage transistor structure, thereby reducing a size of the high voltage resistor device and also reducing a leakage of the high voltage resistor structure (e.g., by removing a leakage path through a contact over the source region 320). For example, FIG. 5 illustrates a cross-sectional view of some additional embodiments of a disclosed high voltage resistor device 500 having a high voltage transistor structure 502 without a source region.

The high voltage resistor device 500 comprises a resistor structure 120 arranged over a first isolation structure 316a. The resistor structure 120 has a high-voltage terminal 122a coupled to a drain region 318 disposed within a drift region 308 and a low-voltage terminal 122b coupled to a body contact region 322 within a body region 310. The body region 310 does not have a source region. Rather, the body contact region 322 has a first doping type along an uppermost surface of the body region 310, which comprises semiconductor material having the first doping type. The semiconductor material having the first doping type within the body region 310 continuously extends between the body contact region 322 and the drift region 308 along the uppermost surface of the body region 310. In some embodiments, the body contact region 322 may be arranged next to the gate structure 118 (e.g., in place of the source region 320 of FIG. 3), so as to reduce an area of the high voltage resistor device 500. In some such embodiments, the body contact region 322 may extend between a sidewall of the gate structure 118 and a sidewall of a second isolation region 316b.

In some additional embodiments, the gate structure 118 may also be electrically coupled to another voltage having a smaller voltage value range than a voltage applied to the low-voltage terminal 122b. That means that in some additional embodiments, the gate structure 118 may also be and/or not be electrically coupled to the low-voltage terminal 122b of the resistor structure 120.

FIGS. 6A-6B illustrate some additional embodiments of a disclosed high voltage resistor device.

As shown in cross-sectional view 600 of FIG. 6A, the high voltage resistor device comprises a resistor structure 120 coupled to a high voltage transistor structure 303. The high voltage transistor structure 303 comprises a drain region 318 laterally surrounded by a first isolation structure 316a. A resistor structure 120 is disposed over the first isolation structure 316a between the drain region 318 and a gate structure 118. In some embodiments, a source region 320 and/or a body contact region 322 may also laterally surround the drain region 318.

The resistor structure 120 has a width w extending between outermost sidewalls facing the gate structure 118. In some embodiments, the width w of the resistor structure 120 may be in a range of between approximately 200 µm and approximately 400 µm. In some additional embodiments, the width w of the resistor structure 120 may be in a range of between approximately 240 µm and approximately 330 µm.

As shown in top-view 604 of FIG. 6B (along cross-section 602 of FIG. 6A), in some embodiments, the drain region 318, the first isolation structure 316a, the gate structure 118, and/or the source region 320 are concentric ring-shaped regions/structures. In some embodiments, the resistor structure 120 may follow a curved path extending between a high-voltage terminal 122a and a low-voltage terminal 122b. In other embodiments, the path may have a different shape. In some embodiments, the curved path winds in a continuous and widening curve around the drain region 318. In some embodiments, the path may be confined above the first isolation structure 316a.

Figure 6C:
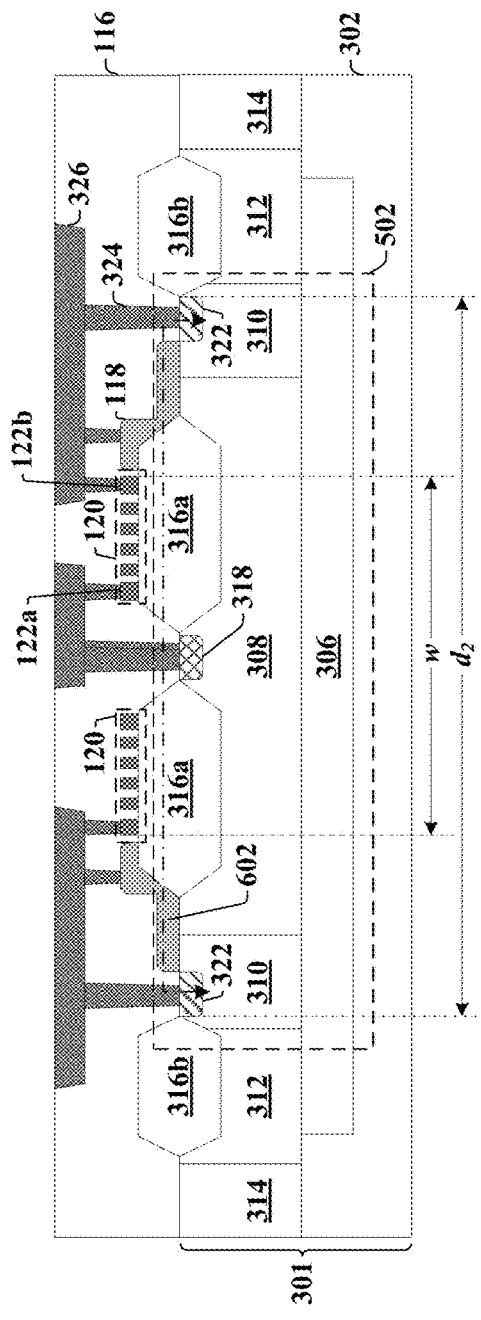
Figure 6D:
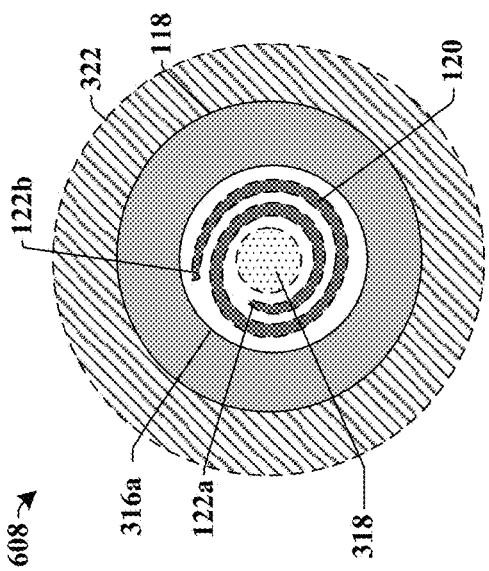

FIGS. 6C-6D illustrate some additional embodiments of a disclosed high voltage resistor device having a high voltage transistor structure 502 without a source region. As shown in cross-sectional view 606 of FIG. 6C and top-view 608 of FIG. 6D, the body region 310 does not have a source region. Without a source region, the high voltage transistor structure 502 has a smaller area and a lower leakage than the high voltage transistor structure 303 of FIG. 6A. For example, in some embodiments, the high voltage transistor structure 303 of FIG. 6A has a first area defined by a first dimension $d_1$ and the high voltage transistor structure 502 of FIG. 6C has a smaller, second area defined by a second dimension $d_2$, where the second dimension $d_2$ is smaller than the first dimension $d_1$.

Although FIGS. 6A-6D describe disclosed high voltage resistor devices having a drain region, a first isolation structure, a gate structure, and/or a source region that are concentric ring-shaped regions/structures, it will be appreciated that the drain region, the first isolation structure, the gate structure, and/or the source region of the disclosed high voltage resistor device are not limited to such shapes. Rather, in alternative embodiments, the drain region, the first isolation structure, the gate structure, and/or the source region may have different shapes as shown in a top-view. For example, the drain region, the first isolation structure, the gate structure, and/or the source region may alternatively be concentric polygon-shaped regions/structures (e.g., a square, a rectangle, a hexagon, etc.), concentric oval-shaped regions/structures, or concentric amorphous shaped regions/structures. Similarly, the resistor structure 120 structure is not limited to a curved path, as described in FIGS. 6A-6D, but rather may alternatively follow a path having straight edges. For example, in some alternative embodiments, the resistor structure may follow a square spiral path.

FIGS. 7-13 illustrate cross-sectional views 700-1300 of some embodiments of a method of forming a high voltage resistor device. Although the cross-sectional views 700-1300 shown in FIGS. 7-13 are described with reference to a method of forming a high voltage resistor device, it will be appreciated that the structures shown in FIGS. 7-13 are not limited to the method of formation but rather may stand alone separate of the method.

Figure 7:
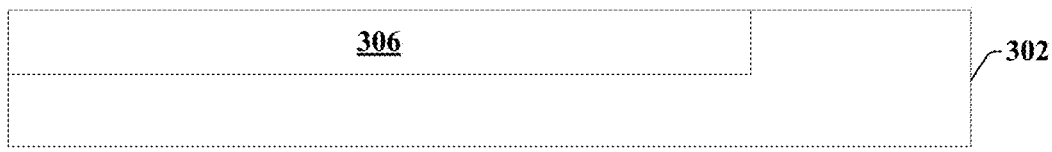
FIGS. 7-13 illustrate cross-sectional views of some embodiments of a method of forming a disclosed high voltage resistor device.

As shown in cross-sectional view 700 of FIG. 7, a buried well region 306 is formed within a first region 302 of a semiconductor substrate. The buried well region 306 comprises a different doping type than the first region 302. For example, in some embodiments, the first region 302 may comprise a first doping type (e.g., p-type) and the buried well region 306 may comprise a second doping type (e.g., n-type). The different doping types of the buried well region 306 and the first region 302 form a vertical p-n junction along an interface therebetween.

In some embodiments, the buried well region 306 may be formed according to an implantation process that selectively introduces a dopant species having the second doping type into the semiconductor substrate. In some embodiments, the dopant species may introduce an n-type dopant (e.g., phosphorous or arsenic) into the semiconductor substrate having a p-type doping. In various embodiments, the semiconductor substrate may be any type of semiconductor body (e.g., silicon, SiGe, SOI, etc.), as well as any other type of semiconductor and/or epitaxial layers, associated therewith.

Figure 8:
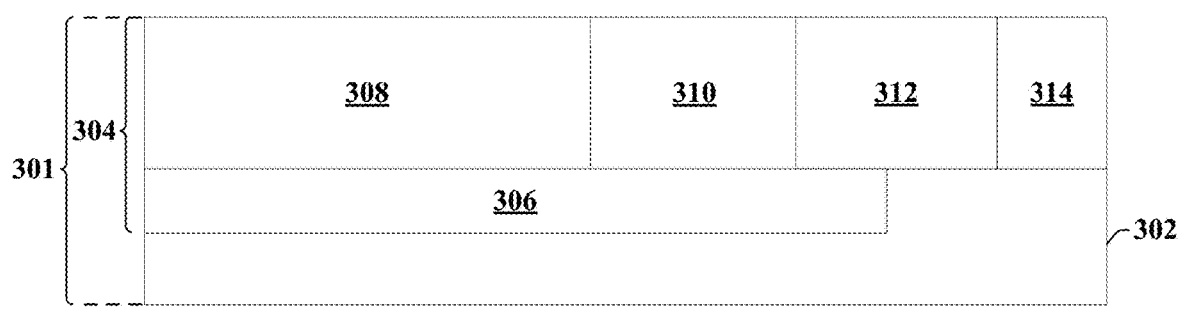

As shown in cross-sectional view 800 of FIG. 8, a drift region 308 is formed over the buried well region 306 and a body region 310 is formed at a location laterally adjacent to the drift region 308.

The drift region 308 comprises a semiconductor material having the second doping type and collectively with the buried well region 306 may form a RESURF drift region 304 within a substrate 301. In some embodiments, the drift region 308 may be formed by an implantation process that selectively implants a dopant species having the second doping type into the substrate 301. In some such embodiments, the dopant species may introduce an n-type dopant (e.g., phosphorous or arsenic) into the substrate 301. In some embodiments, the drift region 308 may be formed by epitaxial growth of a semiconductor material over the semiconductor substrate having the first region 302 followed by an implantation process.

The body region 310 comprises a semiconductor material having the first doping type. The different doping types of the drift region 308 and the body region 310 form a lateral p-n junction along an interface therebetween. In some embodiments, the body region 310 may be formed by an implantation process that selectively implants a dopant species having the first doping type into the substrate 301. In some embodiments, the dopant species having the first doping type may comprise boron, for example. In other embodiments, the body region 310 may be formed by epitaxial growth of a semiconductor material over the semiconductor substrate having the first region 302 followed by an implantation process.

In some additional embodiments, a first isolation region 312 and a second isolation region 314 may be formed within the substrate 301. The first isolation region 312 has the second doping type and laterally abuts the body region 310. The second isolation region 314 has the first doping type and laterally abuts the first isolation region 312. In various embodiments, the first isolation region 312 and the second isolation region 314 may be formed by implantation processes and/or by epitaxial growth processes.

Figure 9:
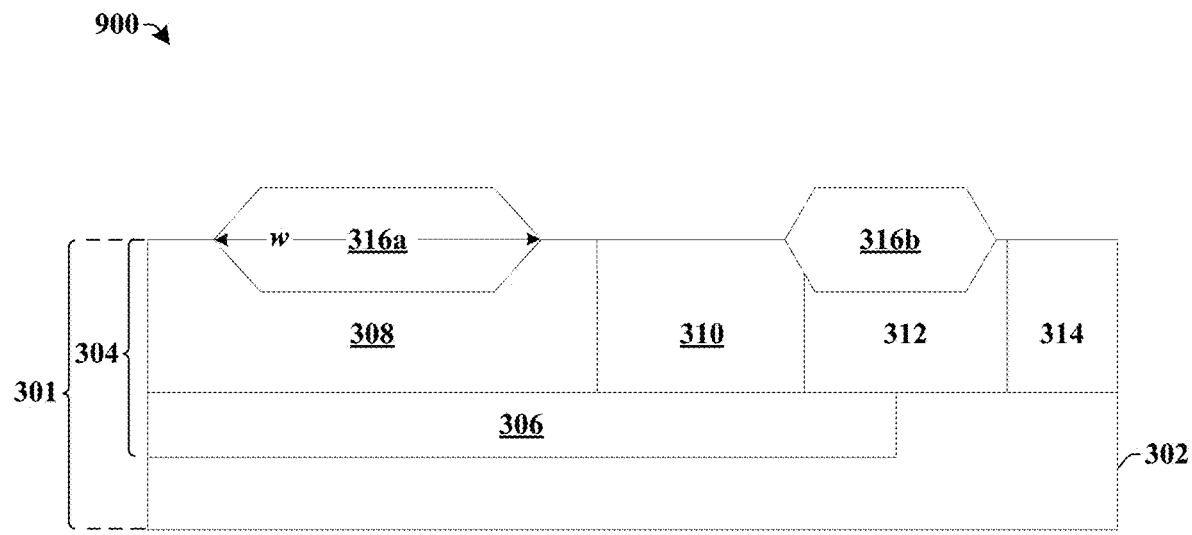

As shown in cross-sectional view 900 of FIG. 9, isolation structures 316a-316b are formed over the substrate 301. The isolation structures 316a-316b comprise a first isolation structure 316a formed over the drift region 308 and a second isolation structure 316b formed over the first isolation region 312. In various embodiments, the isolation structures 316a-316b may comprise a field oxide or a shallow trench isolation (STI) structure. The first isolation structure 316a has a width w that is dependent upon a desired voltage value a high voltage resistor device is configured to receive. For example, if the high voltage resistor device is configured to receive a voltage having a first value, the first isolation structure 316a is formed to have a first width, while if the high voltage resistor device is configured to receive a voltage having a second value greater than the first value, then the first isolation structure 316a is formed to have a second width greater than the first width.

In some embodiments, the first isolation structure 316a and the second isolation structure 316b may be formed by a thermal growth process. For example, in some embodiments, a masking layer (e.g., $Si_3N_4$) may be formed over the substrate 301 and patterned using lithography techniques. The substrate 301 is subsequently exposed to an elevated temperature in a wet or dry environment. The elevated temperature causes an oxide to grow in unmasked regions of the substrate 301 to form the first isolation structure 316a and the second isolation structure 316b. The masking layer is subsequently removed. In other embodiments, the first isolation structure 316a and the second isolation structure 316b may be formed by selectively etching the substrate 301 to form trenches and subsequently depositing one or more dielectric materials within the trenches.

Figure 10:
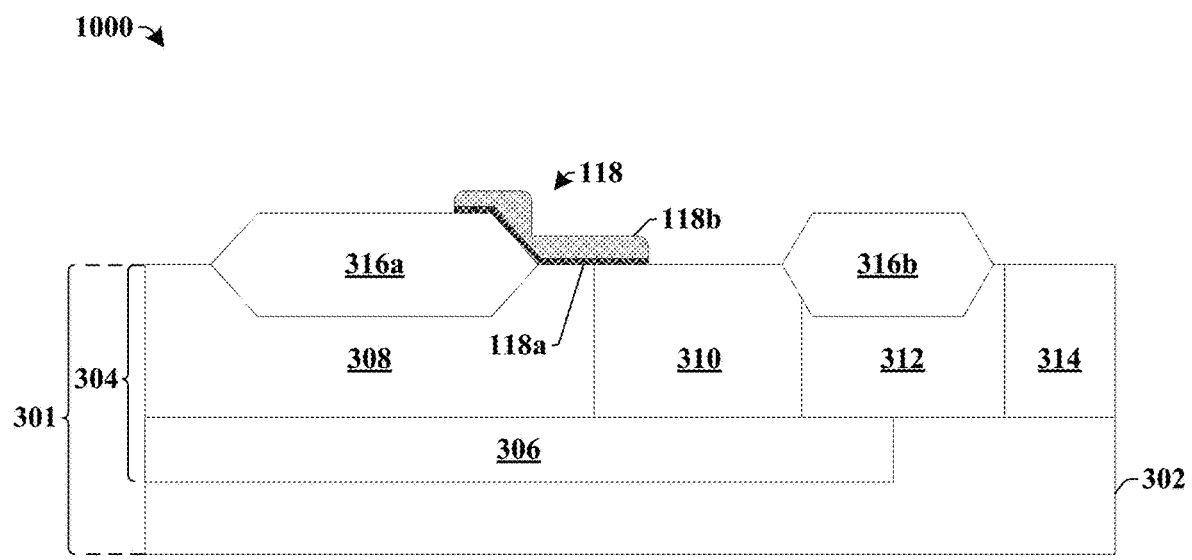

As shown in cross-sectional view 1000 of FIG. 10, a gate structure 118 is formed over the drift region 308, the body region 310, and the first isolation structure 316a. The gate structure 118 comprises a gate electrode 118b separated from the drift region 308, the body region 310, and the first isolation structure 316a by a gate dielectric layer 118a. In some embodiments, the gate structure 118 may be formed by depositing a gate dielectric film and a gate electrode film. In various embodiments, the gate dielectric film may comprise silicon dioxide ($SiO_2$) or a high-k dielectric, while the gate electrode may comprise doped polysilicon or a metal (e.g., aluminum). The gate dielectric film and the gate electrode film are subsequently patterned to form a gate dielectric layer 118a and a gate electrode 118b.

Figure 11:
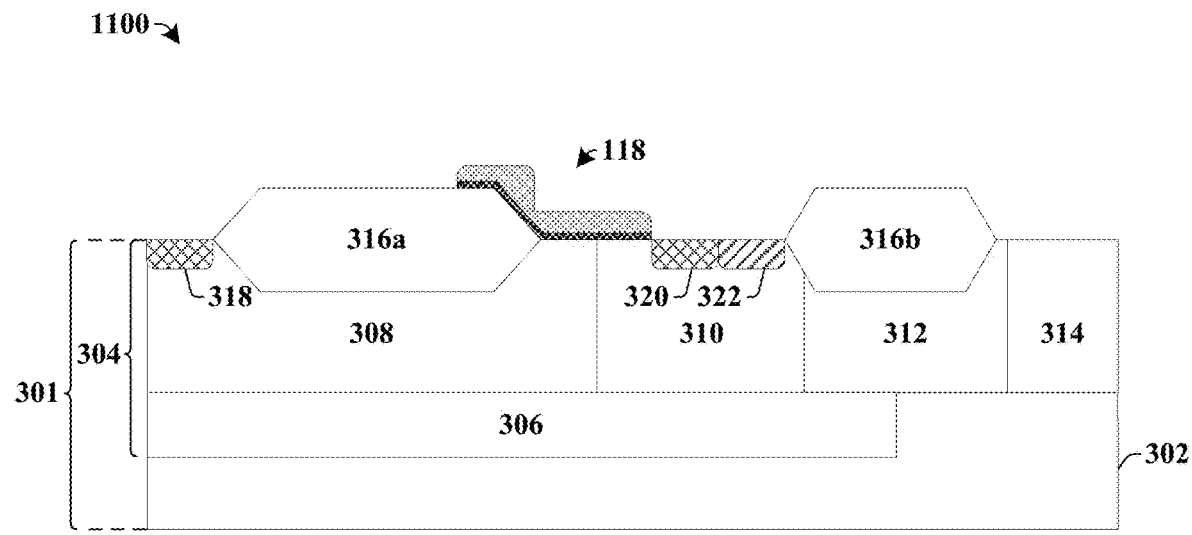

As shown in cross-sectional view 1100 of FIG. 11, a drain region 318 having the second doping type (e.g., n-type) is formed within the drift region 308 along a first side of the first isolation structure 316a opposing the gate structure 118. In some additional embodiments, a source region 320 having the second doping type (e.g., n-type) and/or a body contact region 322 having the first doping type (e.g., p-type) may be formed within the body region 310 along a second side of the first isolation structure 316a. In some embodiments, the drain region 318 and/or the source region 320 may be formed by one or more implantation processes that selectively implant one or more dopant species (e.g., phosphorous or arsenic) into the substrate 301, while the body contact region 322 may be formed by a separate implantation process that selectively implants one or more dopant species (e.g., boron) into the substrate 301.

Figure 12:
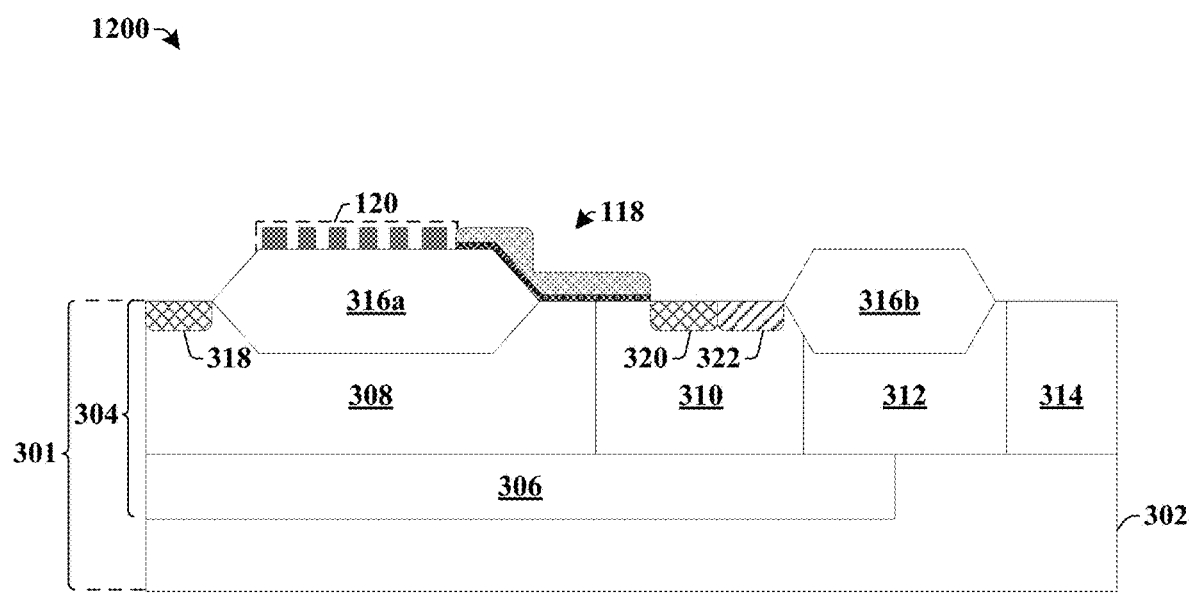

As shown in cross-sectional view 1200 of FIG. 12, a resistor structure 120 is formed over the first isolation structure 316a. The resistor structure 120 may be formed by depositing a resistive material over the first isolation structure 316a and subsequently patterning the resistive material form a path extending between a high-voltage terminal 122a proximate to the drain region 318 and a low-voltage terminal 122b proximate to the body region 310. In some embodiments, the resistive material may comprise polysilicon formed by way of a deposition technique (e.g., physical vapor deposition (PVD), chemical vapor deposition (CVD), PE-CVD, atomic layer deposition (ALD), sputtering, etc.).

In some embodiments, the resistor structure 120 may be formed concurrent with the formation of the gate electrode 118b. In such embodiments, the gate electrode 118b and the resistor structure 120 comprise a same conductive material (e.g., polysilicon) and are patterned using a same patterning process. In other embodiments, the resistor structure 120 may be formed before or after formation of than the gate electrode 118b. In such embodiments, the gate electrode 118b and the resistor structure 120 may comprise a same material (e.g., polysilicon) or different materials.

Figure 13:
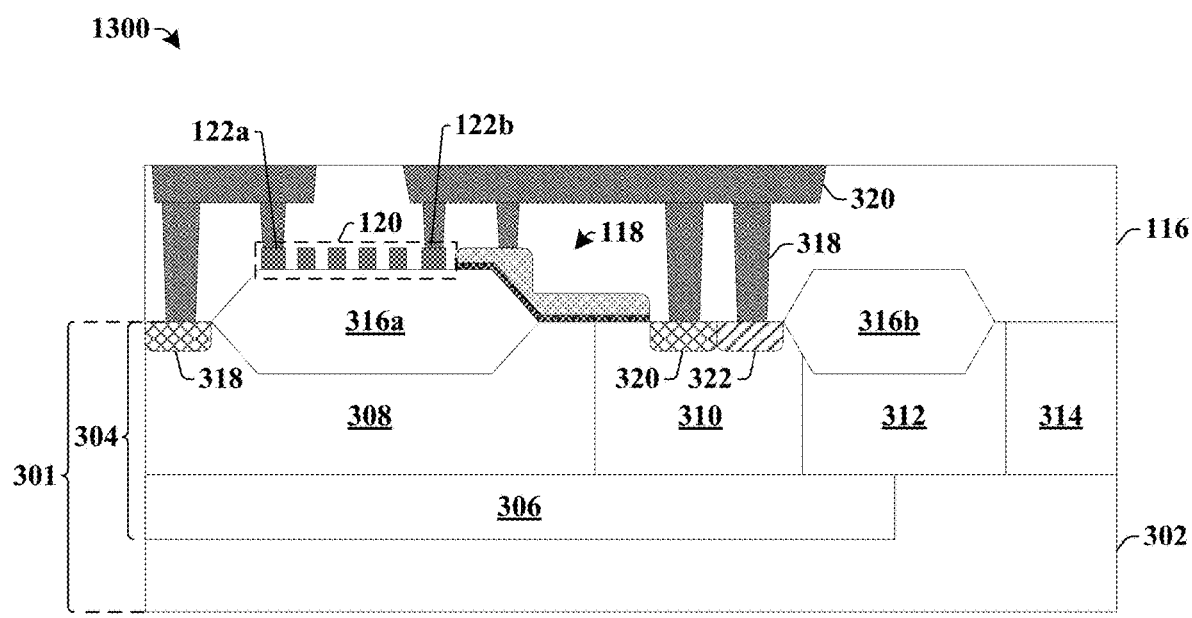

As shown in cross-sectional view 1300 of FIG. 13, one or more interconnect layers 324-326 are formed within a dielectric structure 116 over the substrate 301. The one or more interconnect layers 324-326 are configured to couple the high-voltage terminal 122a of the resistor structure 120 to the drain region 318. In some embodiments, the one or more interconnect layers 324-326 are further configured to couple the low-voltage terminal 122b of the resistor structure 120 to the gate structure 118, the source region 320, and/or the body contact region 322.

In some embodiments, the one or more interconnect layers 324-326 may be formed using a damascene process (e.g., a single damascene process or a dual damascene process). The damascene process is performed by forming an ILD layer over the substrate 301, etching the ILD layer to form a via hole and/or a metal trench, and filling the via hole and/or metal trench with a conductive material. In some embodiments, the ILD layer may be deposited by a physical vapor deposition technique (e.g., PVD, CVD, PE-CVD, ALD, etc.) and the conductive material may be formed using a deposition process and/or a plating process (e.g., electroplating, electro-less plating, etc.). In various embodiments, the one or more interconnect layers 324-326 may comprise tungsten, copper, or aluminum copper, for example.

Figure 14:
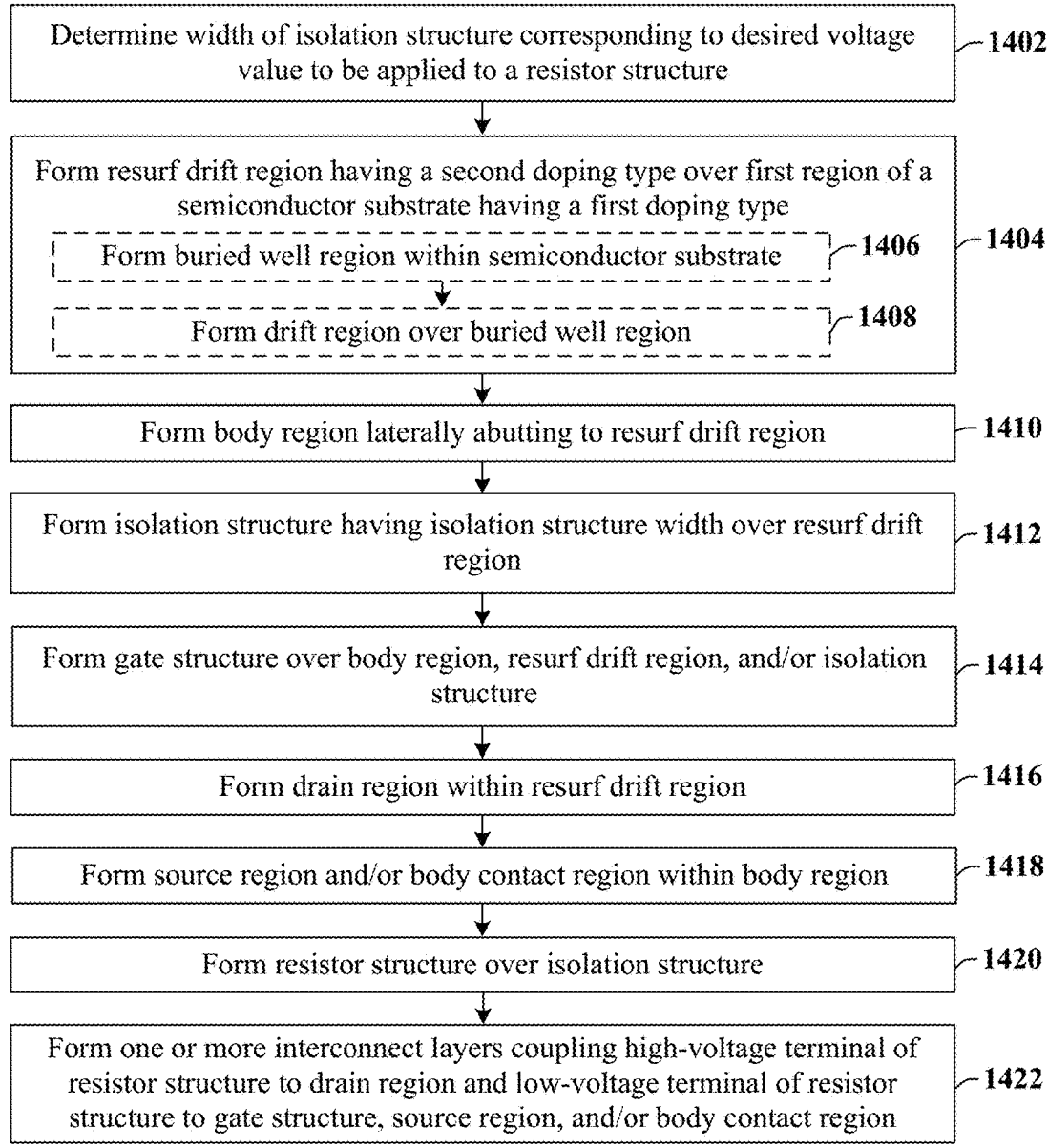
FIG. 14 illustrates a flow diagram of some embodiments of a method of forming a disclosed high voltage resistor device.

FIG. 14 illustrates a flow diagram of some embodiments of a method 1400 of forming a high voltage device in accordance with some embodiments.

While method 1400 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a width of an isolation structure corresponding to a desired voltage value to be applied to a resistor structure is determined.

At 1404, a RESURF drift region having a second doping type is formed over a first region of a semiconductor substrate having a first doping type. The RESURF drift region forms a vertical p-n junction between the RESURF drift region and the first region. In some embodiments, the RESURF drift region may be formed according to acts 1406-1408. At 1406, a buried well region having the second doping type (e.g., n-type) is formed within a substrate having the first doping type (e.g., p-type). At 1408, a drift region having the second doping type is formed over the buried well region. FIGS. 7-8 illustrates cross-sectional views 700-800 of some embodiments corresponding to act 1404.

At 1410, a body region is formed at a location laterally abutting the RESURF drift region. FIG. 8 illustrates a cross-sectional view 800 of some embodiments corresponding to act 1410.

At 1412, an isolation structure having the width is formed over the RESURF drift region. FIG. 9 illustrates a cross-sectional view 900 of some embodiments corresponding to act 1412.

At 1414, a gate structure is formed over the body region, the RESURF drift region, and/or the isolation structure. FIG. 10 illustrates a cross-sectional view 1000 of some embodiments corresponding to act 1414.

At 1416, a drain region is formed within the RESURF drift region. FIG. 11 illustrates a cross-sectional view 1100 of some embodiments corresponding to act 1416.

At 1418, a source region and/or a body contact region are formed within the body region. FIG. 11 illustrates a cross-sectional view 1100 of some embodiments corresponding to act 1418.

At 1420, a resistor structure is formed over the isolation structure. The resistor structure has a high-voltage terminal proximate to the drain region and a low-voltage terminal proximate to the body region. FIG. 12 illustrates a cross-sectional view 1200 of some embodiments corresponding to act 1420.

At 1422, one or more interconnect layers are formed to couple the high-voltage terminal of resistor structure to the drain region and the low-voltage terminal of resistor to the gate region, the source region, and/or the body contact region. FIG. 13 illustrates a cross-sectional view 1300 of some embodiments corresponding to act 1422.

Accordingly, the present disclosure relates to a high voltage resistor device that is able to receive high voltages using a small footprint, and an associated method of fabrication.

In some embodiments, the present disclosure relates to a high voltage resistor device. The resistor device includes a substrate comprising a first region having a first doping type; a drift region arranged within the substrate over the first region and having a second doping type; a body region having the first doping type and laterally contacting the drift region; a drain region arranged within the drift region and having the second doping type; an isolation structure over the substrate between the drain region and the body region; and a resistor structure over the isolation structure and having a high-voltage terminal coupled to the drain region and a low-voltage terminal coupled to a gate structure over the isolation structure. In some embodiments, the resistor structure comprises polysilicon. In some embodiments, the isolation structure surrounds the drain region. In some embodiments, the resistor structure extends between the high-voltage terminal and the low-voltage terminal along a curved path of resistive material. In some embodiments, the resistor device further includes a buried well region having the second doping type, the buried well region has an upper boundary contacting the drift region and the body region and a lower boundary contacting the first region. In some embodiments, the buried well region completely separates the body region from the first region. In some embodiments, the resistor device further includes a body contact region comprising the first doping type and arranged within the body region, the low-voltage terminal of the resistor structure is further coupled to the body contact region. In some embodiments, the body contact region is arranged along an uppermost surface of the body region; and a semiconductor material having the first doping type continuously extends between the body contact region and the drift region along the uppermost surface of the body region. In some embodiments, the resistor device further includes a source region arranged within the body region and having the second doping type; and one or more interconnect layers arranged within a dielectric structure over the substrate and configured to couple to the high-voltage terminal to the drain region and the low-voltage terminal to the gate structure and the source region.

In other embodiments, the present disclosure relates to a high voltage resistor device. The resistor device includes a substrate having a first region comprising a first doping type; a RESURF drift region having a second doping type contacting the first region along a p-n junction; an isolation structure over the RESURF drift region; a drain region having the second doping type disposed within the RESURF drift region, the drain region has a lowermost boundary that is separated from the p-n junction; and a resistor structure over the isolation structure, the resistor structure has a high-voltage terminal proximate to a first side of the isolation structure facing the drain region and a low-voltage terminal proximate to a second side of the isolation structure facing away from the drain region. In some embodiments, the resistor device further includes a body region having the first doping type and laterally contacting the RESURF drift region. In some embodiments, the resistor device further includes a gate structure arranged over the substrate between the isolation structure and the body region. In some embodiments, the resistor device further includes one or more interconnect layers arranged within a dielectric structure over the substrate and configured to couple to the high-voltage terminal to the drain region and the low-voltage terminal to the gate structure. In some embodiments, the RESURF drift region includes a buried well region having the second doping type; and a drift region having the second doping type, the buried well region extends laterally past the drift region to a location underlying the body region. In some embodiments, the resistor device further includes a first isolation region comprising a semiconductor material having the second doping type and laterally contacting the body region; and a second isolation structure comprising a dielectric material arranged over the body region and the first isolation region. In some embodiments, the resistor structure comprises a resistive material disposed in a curved path that winds between the high-voltage terminal and the low-voltage terminal in a continuous and gradually widening curve around the drain region. In some embodiments, the isolation structure is a ring-shaped structure surrounding the drain region and the resistor structure is confined above the isolation structure.

In yet other embodiments, the present disclosure relates to a method of forming a high voltage resistor device. The method includes determining a width of an isolation structure corresponding to a desired voltage value to be applied to a resistor structure; forming a RESURF drift region within a substrate, the RESURF drift region comprises a second doping type and contacts an underlying first region (104) of the substrate having a first doping type; forming a body region having the first doping type and laterally contacting the RESURF drift region; forming the isolation structure over the RESURF drift region, the isolation structure has the width extending between a first side and an opposing second side facing the body region; and forming the resistor structure over the isolation structure, the resistor structure has a high-voltage terminal proximate to the first side and a low-voltage terminal proximate to the second side. In some embodiments, the RESURF drift region includes a buried well region having the second doping type; and a drift region having the second doping type, wherein the buried well region extends laterally past the drift region to a location underlying the body region. In some embodiments, the method further includes forming a drain region within the RESURF drift region along the first side and forming a gate structure along the second side; and forming one or more interconnect layers within a dielectric structure over the substrate, wherein the one or more interconnect layers are configured to couple the high-voltage terminal to the drain region and low-voltage terminal to the gate structure.

In yet other embodiments, the present disclosure relates to a method of forming a high voltage resistor device. The method includes determining a width of an isolation structure corresponding to a desired voltage value to be applied to a resistor structure; forming a high voltage transistor structure within a substrate, the high voltage transistor structure comprises a drift region laterally abutting a body region and a drain region within the drift region; forming the isolation structure over the drift region, the isolation structure has a first side separated from a second side by the width; and forming the resistor structure over the isolation structure, the resistor structure has a high-voltage terminal proximate to the first side and coupled to the drain region and a low-voltage terminal proximate to the second side. In some embodiments, forming the high voltage transistor structure includes forming the drift region having a second doping type over a region of the substrate having a first doping type; forming the body region having the first doping type; and forming the drain region having the second doping type. In some embodiments, forming the high voltage transistor structure further includes forming a body contact region having the first doping type within the body region, the low-voltage terminal is coupled to the body contact region. In some embodiments, forming the resistor structure includes depositing a resistive material over the isolation structure; and patterning the resistive material to define a path extending between the high-voltage terminal and the low-voltage terminal. In some embodiments, the path comprises a curved path that winds in a continuous and widening curve around the drain region. In some embodiments, the method further includes forming a gate structure along the second side, the gate structure continuously extends from a first position over the isolation structure to a second position laterally contacting the isolation structure. In some embodiments, the isolation structure is separated from the body region by a non-zero distance.

In yet other embodiments, the present disclosure relates to a method of forming a high voltage resistor device. The method includes forming a drift region within a substrate, the drift region comprises a second doping type that vertically contacts a region of the substrate having a first doping type; forming a body region within the substrate, the body region has the first doping type and laterally contacts the drift region; forming an isolation structure over the drift region; forming a resistor structure over the isolation structure, the resistor structure extends along a curved path between a high-voltage terminal and a low-voltage terminal; and forming one or more interconnect layers within a dielectric structure over the substrate, the one or more interconnect layers couple the high-voltage terminal to a drain region arranged within the drift region and having the second doping type. In some embodiments, the method further includes forming a body contact region having the first doping type within the body region, the one or more interconnect layers couple the low-voltage terminal to the body contact region. In some embodiments, the method further includes forming a gate structure between the isolation structure and the body region. In some embodiments, forming the resistor structure includes depositing a resistive material over the isolation structure; and patterning the resistive material to define the curved path extending between the high-voltage terminal and the low-voltage terminal. In some embodiments, the curved path winds in a continuous and widening curve around the drain region. In some embodiments, the isolation structure is separated from the body region by a non-zero distance.

In some embodiments, the present disclosure relates to a high voltage resistor device. The resistor device includes a high voltage transistor structure arranged within a substrate; an isolation structure arranged over the high voltage transistor structure, the isolation structure has a first side and a second side; and a resistor structure over the isolation structure and having a high-voltage terminal coupled to a drain region arranged within the substrate along the first side of isolation structure and a low-voltage terminal proximate to the second side of the isolation structure, the high voltage transistor structure is configured to provide for a reduction of a voltage within the substrate between the drain region and the second side. In some embodiments, the high voltage transistor structure includes a drift region having a second doping type and arranged over a first region of the substrate having a first doping type; and a body region having the first doping type and laterally contacting the drift region. In some embodiments, the body region does not comprise a source region. In some embodiments, the first doping type is p-type and the second doping type is n-type. In some embodiments, the isolation structure protrudes outward from the drift region. In some embodiments, the resistor structure has a width extending between outermost sidewalls that is in a range of between approximately 200 μm and approximately 400 μm. In some embodiments, the resistor structure is configured to provide a first current that is proportion to a first voltage applied to the high-voltage terminal according to a first constant of proportionality when the first voltage is smaller than a breakdown voltage of the high voltage transistor structure; and the resistor structure is configured to provide a second current that is proportion to a second voltage applied to the high-voltage terminal according to a second constant of proportionality that is larger than the first constant of proportionality when the second voltage is larger than the breakdown voltage of the high voltage transistor structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high voltage resistor device, comprising:
a buried well region disposed within a substrate and having a first doping type;
a drift region disposed within the substrate and contacting the buried well region, wherein the drift region has the first doping type;
a body region disposed within the substrate and having a second doping type, wherein the body region laterally contacts the drift region and vertically contacts the buried well region;
an isolation structure over the drift region;
a resistor structure over the isolation structure;
a gate structure arranged over both the substrate and the isolation structure; and
one or more conductive interconnect layers arranged within a dielectric structure over the substrate and configured to couple a first terminal of the resistor structure to a drain region and to couple a second terminal of the resistor structure to the gate structure and to a source region.

2. The resistor device of claim 1, wherein the resistor structure has an outermost sidewall that is separated from a closest sidewall of the gate structure by the dielectric structure along a direction that is parallel to an upper surface of the substrate.

3. The resistor device of claim 1, wherein the resistor structure directly contacts an upper surface of the isolation structure.

4. The resistor device of claim 1, wherein the isolation structure comprises a bottom surface that is below an upper surface of the substrate and a top surface that is over the upper surface of the substrate.

5. The resistor device of claim 1, wherein a horizontal plane that is parallel to an upper surface of the substrate laterally extends through a sidewall of the gate structure and through a sidewall of the resistor structure.

6. The resistor device of claim 1, wherein the resistor structure follows a spiral path as viewed from a top-view of the resistor structure.

7. The resistor device of claim 1, wherein a part of the resistor structure is below a top surface of the gate structure.

8. The resistor device of claim 1, wherein an outermost boundary of the body region is directly below the gate structure.

9. The resistor device of claim 1, further comprising:
a second isolation structure over the substrate, wherein the second isolation structure has a first side that contacts the body region and is separated from the drift region by the body region; and
a well region directly below the second isolation structure and laterally extending past a second side of the second isolation structure.

10. A resistor device, comprising:
a drift region disposed within a substrate and having a first doping type;
a body region disposed within the substrate and having a second doping type, the body region having a bottom-most boundary that intersects an outermost side of the drift region at a point that is directly below a gate structure disposed over the substrate;
an isolation structure arranged over the drift region;
a resistor structure disposed over the isolation structure;
a drain region disposed within the drift region;
a source region disposed within the body region, wherein a plurality of conductive interconnect layers electrically couple the resistor structure between the source region and the drain region;
wherein the resistor structure has a high-voltage terminal coupled to the drain region and a low-voltage terminal coupled to the source region;
wherein the resistor structure is configured to provide a first current that is proportion to a first voltage applied to the high-voltage terminal according to a first constant of proportionality when the first voltage is smaller than a breakdown voltage of the resistor device; and
wherein the resistor structure is configured to provide a second current that is proportion to a second voltage applied to the high-voltage terminal according to a second constant of proportionality that is larger than the first constant of proportionality when the second voltage is larger than the breakdown voltage of the resistor device.

11. The resistor device of claim 10, wherein the resistor structure has a width extending between outermost sidewalls that is in a range of between approximately 200 um and approximately 400 um.

12. The resistor device of claim 10, wherein the isolation structure protrudes outward from the drift region.

13. The resistor device of claim 10, wherein an outermost side of the body region is directly below the gate structure.

14. The resistor device of claim 10, further comprising:
a second isolation structure over the substrate, wherein the second isolation structure contacts the body region and is separated from the drift region by the body region;
a well region directly below the second isolation structure and laterally contacting the body region; and
a buried well region arranged directly below the drift region and the body region, wherein the buried well region covers part, but not all, of a bottom of the well region.

15. A resistor device, comprising:
a drift region disposed within a substrate and having a first doping type;
a body region disposed within the substrate and having a second doping type, the body region having a bottommost boundary that intersects an outermost side of the drift region at a point that is directly below a gate structure disposed over the substrate;
an isolation structure arranged over the drift region;
a resistor structure disposed over the isolation structure;
a second isolation structure over the substrate, wherein the second isolation structure contacts the body region and is separated from the drift region by the body region;
a well region directly below the second isolation structure and laterally contacting the body region; and
a buried well region arranged directly below the drift region and the body region, wherein the buried well region covers part, but not all, of a bottom of the well region.

16. The resistor device of claim 15, further comprising:
a drain region disposed within the body region and having the first doping type; and
a body contact region disposed within the body region and having the second doping type, wherein the body contact region laterally extends along an upper surface of the substrate from the gate structure to the second isolation structure.

17. The resistor device of claim 16, wherein a source region is not arranged within the body region.

18. The resistor device of claim 10, wherein the resistor structure has a bottommost surface that is completely confined over the isolation structure.

19. The resistor device of claim 10, wherein the isolation structure wraps around the source region in a first continuous loop.

20. The resistor device of claim 19, wherein the gate structure wraps around the isolation structure in a second continuous loop.

* * * * *